United States Patent
Kaltenbacher et al.

(10) Patent No.: US 8,261,439 B2
(45) Date of Patent: Sep. 11, 2012

(54) METHOD FOR CONTACTING ELECTRONIC COMPONENTS BY MEANS OF A SUBSTRATE PLATE

(75) Inventors: Axel Kaltenbacher, Ingolstadt (DE); Michael Kaspar, Putzbrunn (DE); Gernot Schimetta, München (DE); Karl Weidner, München (DE); Robert Weinke, München (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 177 days.

(21) Appl. No.: 12/733,507

(22) PCT Filed: Aug. 4, 2008

(86) PCT No.: PCT/EP2008/060196
§ 371 (c)(1),
(2), (4) Date: Apr. 20, 2010

(87) PCT Pub. No.: WO2009/030562
PCT Pub. Date: Mar. 12, 2009

(65) Prior Publication Data
US 2010/0208438 A1 Aug. 19, 2010

(30) Foreign Application Priority Data
Sep. 4, 2007 (DE) .......................... 10 2007 041 921

(51) Int. Cl.
*H01R 43/00* (2006.01)
(52) U.S. Cl. .............................. 29/854; 29/832; 29/840
(58) Field of Classification Search .................... 29/832, 29/840, 854
See application file for complete search history.

(56) References Cited

U.S. PATENT DOCUMENTS

| 5,389,191 | A | * | 2/1995 | Muramatsu et al. ......... 156/510 |
| 5,427,641 | A | * | 6/1995 | Muramatsu et al. ......... 156/252 |
| 6,306,680 | B1 | | 10/2001 | Fillion et al. |
| 7,503,109 | B2 | * | 3/2009 | Kawada ...................... 29/832 |
| 2005/0167849 | A1 | | 8/2005 | Sato |

FOREIGN PATENT DOCUMENTS

DE  10 20040 30 042 A1  1/2006
EP     1 641 035 A1     3/2006

OTHER PUBLICATIONS

International Search Report for Application No. PCT/EP2008/060196; mailed Feb. 2, 2009.

* cited by examiner

*Primary Examiner* — Carl Arbes
(74) *Attorney, Agent, or Firm* — Staas & Halsey LLP

(57) ABSTRACT

One unhoused electronic component, e.g., a semiconductor power component, has at least one connecting surface disposed on a top side and/or on a bottom side for fastening and/or for electric contacting. One side of the component is attached to and/or electrically contacts a direct copper bonding ceramic substrate, at an opposing connecting surface in the region of the connecting surface. An electrically insulating carrier film is created on the substrate on the side facing the component outside the region of the connecting surface and extending beyond the bottom side. An electrically conducting conductor part is attached to and/or electrically contacts the connecting surface on the top side. A pre-formed, three dimensional structure is formed extending beyond the area of the top side, thus creating an electrically insulating mass between the carrier film and the three-dimensional structure of the conductor part.

9 Claims, 2 Drawing Sheets

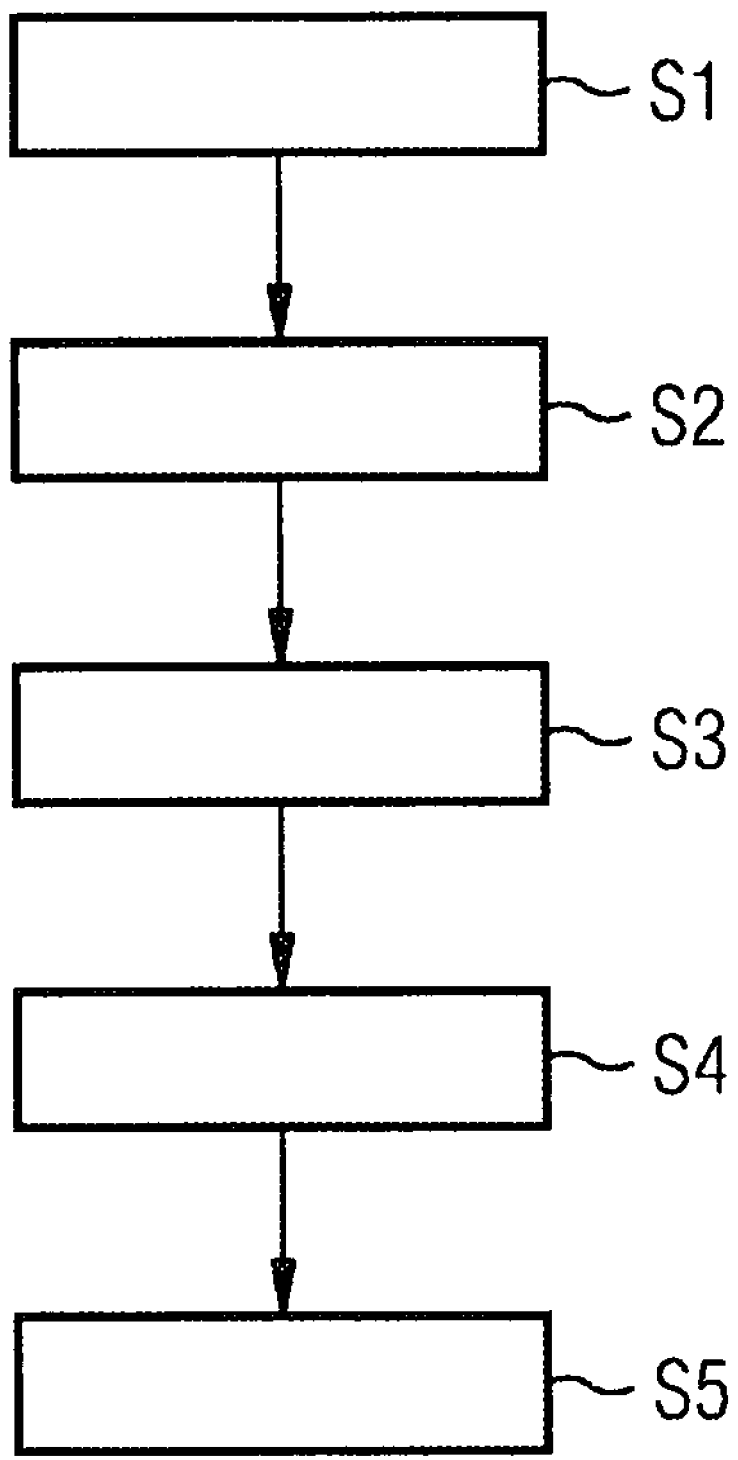

METHOD FOR CONTACTING ELECTRONIC COMPONENTS BY MEANS OF A SUBSTRATE PLATE

CROSS REFERENCE TO RELATED APPLICATIONS

This application is the U.S. national stage of International Application No. PCT/EP2008/060196, filed Aug. 4, 2008 and claims the benefit thereof. The International Application claims the benefits of German Application No. 10 2007 041 921.1 filed on Sep. 4, 2007, both applications are incorporated by reference herein in their entirety.

BACKGROUND

In the electrical contacting of one or more unpackaged chips and/or passive components, in particular in the power electronics field, DCB (Direct Copper Bonding) ceramics are known to be used as a substrate. In such processes the components are soldered onto the DCB ceramic substrate plate with their back side in surface-to-surface contact with the substrate plate. The electrical contacting can be realized by thick-wire bonding or alternatively by what is called planar contacting according to WO 03030247. The content of this disclosure belongs explicitly to the disclosure of the present application. In contrast to thick-wire bonding, planar contacting is achieved by laminating an insulating film onto the electronic component, opening contact windows in particular by laser ablation and establishing the planar connection by electrodeposited metallization.

SUMMARY

An aspect is to provide a low-cost technique of electrically contacting at least one unpackaged electronic component, in particular a power component or semiconductor power component, in particular for the high-voltage range greater than 1000 volts, having contact surfaces for attachment and/or for electrical contacting on a top side and/or bottom side. A further aim is to achieve high integration density, low-inductance contacting performance, high current-carrying capacity, effective cooling and/or high reliability in terms of electrical and thermal cycle stress loading.

Electrical cycle stress means the alternating intermittent loading under a low electrical power and a high electrical power with a specific number of load changes. Thermal cycle stress means the alternating intermittent loading under a low temperature, for example −40° C., and a high temperature, for example +125° C., with a specific number of temperature changes, for example 100 to 1000 cycles.

A conductor part is an electrical conductor having high electrical conductivity and great current-carrying capacity, the conductor being easily workable mechanically, by stamping, cutting and/or bending for example, and plastically deformable. A conductor part of the type can also be referred to as a cut-and-bent part. For example, a conductor part can be a leadframe, in particular a copper leadframe.

A contact strap is a bent section of the conductor part serving for electrically contacting a contact surface of the substrate and/or for attaching the conductor part to the contact surface.

A DCB ceramic is known to be used as a substrate, with electronic components being soldered onto the substrate with their back side in surface-to-surface contact therewith. "DCB" stands for "direct copper bonding". In the production of a DCB ceramic, copper plates are rolled onto the top side and bottom side of a ceramic and bonded with the latter in a positive-locking manner at a temperature of approx. 1080° C. At least one of the two copper sides is then patterned in a wet-chemical process. A known manufacturer of ceramics of this type is "Curamik".

Low-cost mounting and wiring of unpackaged electronic components on substrates, in particular on DCB ceramics, can be implemented by the proposed solution, wherein an easy-to-produce injection-molded plastic is used as the insulating material. Low-inductance contacting of the components can be provided by the proposed solution.

According to an advantageous embodiment, the conductor part embodies at least one contact strap extending as far as the film plane. The carrier film is also removed in the region of the contact strap. The contact strap is attached to and/or electrically contacted with an oppositely disposed contact surface on the substrate plate. In this way a high current-carrying capacity can be provided by thick connections formed of electrically highly conductive material. The conductor part is an embodiment variant for an electrical connection formed of electrically highly conductive material having high current-carrying capacity and being easily workable mechanically, such as by stamping, cutting and/or bending, for example. The material can be molded plastically.

According to a further advantageous embodiment, in the case of a conductor part extending as far as the film plane, the carrier film is removed in the region of the contact strap and the contact strap is attached to and/or electrically contacted with an oppositely disposed contact surface on the substrate.

According to a further advantageous embodiment, conductor parts are attached and/or electrically contacted by soldering. In this way the part is easily workable. The electronic components mounted on the film are soldered on the exposed top side to a correspondingly pre-formed conductor part which includes copper, for example.

According to a further advantageous embodiment, the electrically insulating mass is produced by injection molding, wherein in the case of the insulating material one sealing side forms the film and the other a correspondingly pre-formed three-dimensional injection molding tool corresponding to the embodiment of the cut-and-bent part.

According to a further advantageous embodiment, the carrier film is photosensitive, thereby enabling the carrier film to be easily removed by photoexposure. Another advantageous and simple possibility of removing the carrier film is by ablation, in particular laser ablation. In this way the bottom side of the electronic component and the contact strap routed thereunder are stripped of film material by photoexposure or by ablation methods (lasers and the like). According to this embodiment, the carrier film can be opened at a suitable point in a subsequent step. When ablation is used the carrier film does not have to be photosensitive.

According to a further advantageous embodiment, the contact surface on the bottom side and/or the contact strap are attached to and/or electrically contacted with the respective contact surface of the substrate plate by soldering and/or adhesive bonding. This simplifies attachment and/or electrical contacting. A concluding soldering or adhesive bonding method electrically connects a provided DCB substrate plate to the exposed surfaces of the electrical contacts.

According to a further advantageous embodiment, the components are attached at specific positions on the carrier film, corresponding to a specific functional layout of a device that is to be produced. In other words, first electronic components are adhesively mounted by their bottom side at specific positions onto the electrically insulating carrier film. This means that a preliminary design concept of a device can be implemented at a particularly early stage.

According to a further advantageous embodiment, an arrangement to provide cooling, in particular a cooling channel, a heatsink or a heatpipe, is positioned in the electrically insulating mass and/or on the substrate plate. In this way cooling with a high cooling performance can be provided. A cooling arrangement can also be embodied on each of the two sides, that is to say both on the bottom side of the DCB substrate and on the top side of the electronic component.

According to a further advantageous embodiment, the conductor part has an electrically highly conductive material, for example copper.

According to a further advantageous embodiment, the coefficients of expansion of conductor part and electrically insulating material are matched to one another in order to produce a high thermomechanical and electrical cycle stability.

According to a further advantageous embodiment, arrangements are created which remain fixed on the carrier film.

BRIEF DESCRIPTION OF THE DRAWINGS

These and other aspects and advantages will become more apparent and more readily appreciated from the following description of exemplary embodiments, taken in conjunction with the accompanying drawings of which:

FIG. 2 is a flowchart of an exemplary embodiment of a method for the production of the device.

DETAILED DESCRIPTION OF THE PREFERRED EMBODIMENT

Figure 1:
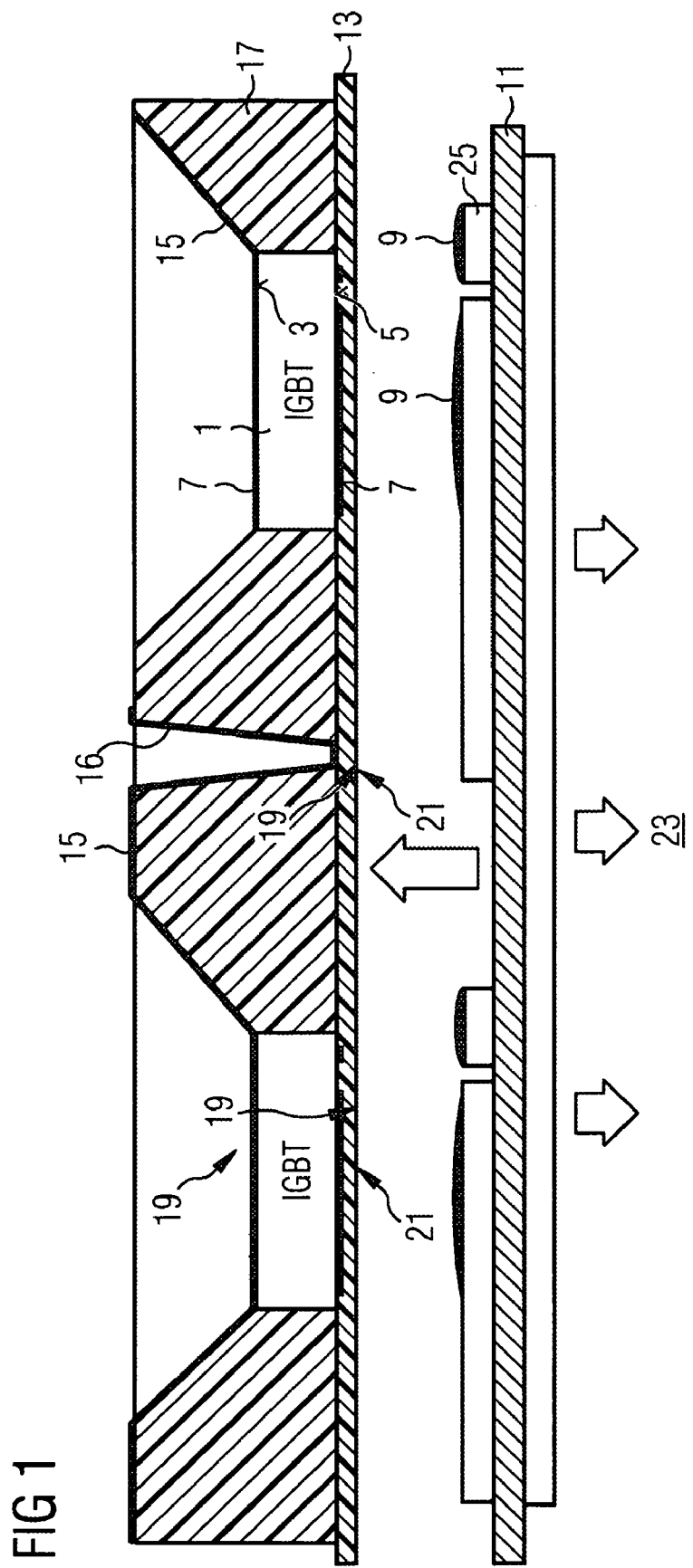
FIG. 1 is a cross sectional view of an exemplary embodiment of a device.

Reference will now be made in detail to the preferred embodiments, examples of which are illustrated in the accompanying drawings, wherein like reference numerals refer to like elements throughout.

FIG. 1 shows two unpackaged electronic components 1, specifically two insulated gate bipolar transistors (IGBTs). A contact surface 7 is produced on a top side 3 in each case. Two contact surfaces 7 are produced on a bottom side 5 in each case. All the contact surfaces 7 are used for attaching and/or electrically contacting the electronic component 1. The electronic component 1 is, for example, a power semiconductor component, and in particular an electronic component for voltages in excess of 1000 volts. The component 1 is attached by its bottom side 5 on an electrically insulating carrier film 13 extending beyond the surface area of the bottom side 5. A pre-formed three-dimensional structure acting as an electrically conducting conductor part 15 is attached to and electrically contacted with the contact surface 7 on the top side 3, the conductor part 15 extending beyond the surface area of the top side 3. An electrically insulating mass 17 is produced between the carrier film 13 and the three-dimensional structure of the conductor part 15. The electrically insulating mass 17 can be produced, for example, by injection molding. In this case known injection molding tools in particular can be used for molding the electrically insulating mass 17. According to FIG. 1 the conductor part 15 produces a contact strap 16 extending as far as the plane of the carrier film 13. The carrier film 13 is produced with openings 21 at the contact surfaces 7 on the bottom side 5 of the component 1. The carrier film 13 is also removed in the region of the contact strap 16 and accordingly has an opening 21.

A substrate 11 is produced beneath the carrier film 13. Particularly advantageously the substrate is a direct copper bonding (DCB) ceramic substrate. Conductor tracks on which contact surfaces 9 of the substrate 11 are produced are prepatterned on its top side. Contact surfaces 9 of this type are disposed opposite the contact surfaces 7 on the side of the components 1. The component 1 is attached by its bottom side 5, in the region of the two contact surfaces 7, to the two oppositely disposed contact surfaces 9 on the substrate 11 and electrically contacted. The contacting is realized particularly simply by solder 19. In the case of the conductor part 15 extending as far as the plane of the carrier film 13, the carrier film 13 has been removed in the region of the contact strap 16 and has an opening 21. The contact strap 16 is attached to and electrically contacted with the oppositely disposed contact surface 9 on the substrate 11. The three lower arrows directed downward away from the substrate according to FIG. 1 point in the direction of a heatsink 23 provided for cooling the device. Alternatively an arrangement to provide cooling, in particular a cooling channel, a heatsink 23 and/or a heatpipe can be positioned or produced on the conductor part 15, in the electrically insulating mass 17 and/or on the substrate 11. The upward-directed arrow in FIG. 1 indicates the attachment and electrical contacting of the substrate 11 to the contact surfaces 9 and of the electronic components 1 to the contact surfaces 7.

FIG. 2 shows an exemplary embodiment of a method for contacting at least one unpackaged electronic component 1, in particular a power component or semiconductor power component, having at least one contact surface 7 disposed in each case on a top side 3 and/or a bottom side 5 for the purpose of attachment and/or electrical contacting.

At 1, the component 1 is attached by its bottom side 5 onto an electrically insulating carrier film 13 extending beyond the surface area of the bottom side 5. At S2, the contact surface 7 on the top side 3 is attached to and/or electrically contacted with in each case an electrically conducting conductor part 15 embodying a pre-formed three-dimensional structure and extending beyond the surface area of the top side 3. At S3, an electrically insulating mass 17 is produced between the carrier film 13 and the three-dimensional structure of the conductor part 15. A known injection molding method can be used for this. In particular known tool parts can be used to delimit the electrically insulating mass 17. At S4, the carrier film 13 is removed from the bottom side 5 in the region of the contact surfaces 7. At S5, finally, on the bottom sides 5 the contact surfaces 7 on the bottom sides 5 are attached to and electrically contacted with the corresponding contact surfaces 7 of the oppositely disposed contact surfaces 9 on the conductor tracks 25 on the substrate 11, a direct copper bonding (DCB) ceramic substrate plate 11 particularly advantageously being used for this.

It is herewith pointed that the device according to FIG. 1 is merely an exemplary embodiment. In principle any unpackaged electronic components 1 can be used. The device is suitable in particular for components in the high-voltage range greater than 1000 volts. The components can be attached and/or electrically contacted at specific positions on the carrier film 13 in accordance with a specific functional layout. Further examples of electronic components 1 are diodes, thyristors, transistors and the like. A plurality of contact straps 16 can also be used. Contact straps 16 are basically not indispensable. Reference sign 25 designates a conductor track structure on the substrate 11. In the case of a DCB substrate the conductor tracks 25 include in particular copper.

In principle the device without a substrate plate 11 is likewise encompassed as an arrangement within the scope of protection.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A method for contacting at least one unpackaged electronic component, having at least one contact surface disposed in each case on at least one of a top side and a bottom side for at least one of attachment and electrical contacting, comprising:

attaching the component by the bottom side thereof onto an electrically insulating carrier film extending beyond a surface area of the bottom side;

at least one of attaching and electrically contacting the contact surface on the top side of the component to and/or with an electrically conducting conductor part embodying a pre-formed three-dimensional structure and extending beyond a surface area of the top side;

producing an electrically insulating mass between the carrier film and the three-dimensional structure of the conductor part;

removing the carrier film from the bottom side in the region of the contact surface; and at least one of attaching and electrically contacting the contact surface on the bottom side thereof to and/or with a contact surface on a direct copper bonding substrate prepatterned with electrical conductors and disposed opposite the contact surface.

2. The method as claimed in claim 1, further comprising producing, from the conductor part, at least one contact strap extending as far as a plane of the carrier film.

3. The method as claimed in claim 2, wherein, in the case of the conductor part extending as far as the plane of the carrier film, said removing of the carrier film is performed in a region of the contact strap, and further comprising at least one of attaching and electrically contacted the contact strap to and/or with an oppositely disposed contact surface on the substrate.

4. The method as claimed in claim 3, wherein the conductor part is formed of an electrically highly conductive material and/or the contact surfaces of the component are attached to and/or electrically contacted with the substrate by solder.

5. The method as claimed in claim 4, wherein said producing the electrically insulating mass comprises at least one of injection molding and using an injection molding tool for molding the electrically insulating mass.

6. The method as claimed in claim 5, wherein the carrier film is photosensitive and said removing of the carrier film is performed by at least one of photoexposure and ablation.

7. The method as claimed in claim 6, wherein said at least one of attaching and electrically contacting the contact surface on the bottom side thereof to and/or with a contact surface on the direct copper bonding substrate is performed by at least one of soldering and adhesive bonding.

8. The method as claimed in claim 7, wherein multiple components are attached at specific positions on the carrier film in accordance with a specific functional layout.

9. The method as claimed in claim 8, further comprising positioning an arrangement to provide cooling, formed by at least one of a cooling channel, a heatsink and a heatpipe, on the conductor part, in the electrically insulating mass and/or on the substrate.

* * * * *